(12) United States Patent
Kim et al.

(10) Patent No.: US 10,692,748 B2
(45) Date of Patent: Jun. 23, 2020

(54) HIGH-TECH TEMPERATURE CONTROL DEVICE FOR SEMICONDUCTOR MANUFACTURING FACILITY

(71) Applicant: Global Standard Technology Co., LTD., Hwaseong-si, Gyeonggi-do (KR)

(72) Inventors: Jong Bae Kim, Yongin-si (KR); Seung Jin Yang, Seoul (KR); Jae Suk Heo, Hwaseong-si (KR); Chi Won Choi, Goyang-si (KR); Je Min Kim, Chuncheon-si (KR); Hyeung Kwan Kim, Suwon-si (KR); Yong Ho Choi, Ansan-si (KR)

(73) Assignee: GLOBAL STANDARD TECHNOLOGY CO., LTD. (KR)

( * ) Notice: Subject to any disclaimer, the term of this patent is extended or adjusted under 35 U.S.C. 154(b) by 364 days.

(21) Appl. No.: 15/828,655

(22) Filed: Dec. 1, 2017

(65) Prior Publication Data
US 2018/0158710 A1    Jun. 7, 2018

(30) Foreign Application Priority Data
Dec. 5, 2016 (KR) .................. 10-2016-0164378

(51) Int. Cl.
*H01L 21/683* (2006.01)
*B23Q 3/15* (2006.01)
(Continued)

(52) U.S. Cl.
CPC ........... *H01L 21/6831* (2013.01); *B23Q 3/15* (2013.01); *G01K 1/14* (2013.01); *H01L 21/205* (2013.01);
(Continued)

(58) Field of Classification Search
USPC ........................................ 361/234
See application file for complete search history.

(56) References Cited

U.S. PATENT DOCUMENTS 6,853,533 B2   2/2005  Parkhe
7,718,932 B2   5/2010  Steger
(Continued)

FOREIGN PATENT DOCUMENTS

EP       0486966 B1    5/1992
JP    2015-001372 A    1/2015
(Continued)

OTHER PUBLICATIONS

Japanese Office Action (JP 2017-228684), JPO, dated Sep. 25, 2018.

*Primary Examiner* — Danny Nguyen
(74) *Attorney, Agent, or Firm* — Park & Associates IP Law, P.C.

(57) ABSTRACT

The present invention relates to a high-tech temperature control device for a semiconductor manufacturing facility and, more specifically, to a high-tech temperature control device for an electrostatic chuck, which supports a wafer and maintains the temperature in a semiconductor wafer processing process. It is possible to very precisely control a temperature of an electrostatic chuck by maintaining temperatures and a mixing flow rate of a heating heat medium and a cooling heat medium constant and adjusting a mixing ratio. Meanwhile, the heat medium after heating and cooling is collected and reused, thereby efficiently using energy.

14 Claims, 7 Drawing Sheets

(51) Int. Cl.
*H01L 21/67* (2006.01)
*H01L 21/205* (2006.01)
*H01L 21/3065* (2006.01)
*G01K 1/14* (2006.01)

(52) U.S. Cl.
CPC .... *H01L 21/3065* (2013.01); *H01L 21/67017* (2013.01); *H01L 21/67103* (2013.01); *H01L 21/67109* (2013.01); *H01L 21/67248* (2013.01)

(56) References Cited

U.S. PATENT DOCUMENTS

| | | |
|---|---|---|
| 8,941,968 B2 | 1/2015 | Justesen et al. |
| 9,269,600 B2 | 2/2016 | Miura et al. |
| 2010/0224352 A1* | 9/2010 | Stuckey ............. H01L 23/4735 165/185 |
| 2014/0131005 A1 | 5/2014 | Atlas |
| 2014/0262199 A1* | 9/2014 | Kobayashi ......... G05D 23/1934 165/294 |

FOREIGN PATENT DOCUMENTS

| | | |
|---|---|---|
| JP | 2015-079930 A | 4/2015 |
| KR | 10-0817419 B1 | 3/2008 |
| KR | 10-2009-0045857 A | 5/2009 |
| KR | 10-1367086 B1 | 2/2014 |
| TW | I652756 B | 3/2019 |

* cited by examiner

HIGH-TECH TEMPERATURE CONTROL DEVICE FOR SEMICONDUCTOR MANUFACTURING FACILITY

REFERENCE TO RELATED APPLICATIONS

This application claims the priority benefit of Korean Patent Application No. 10-2016-0164378 filed on Dec. 5, 2016, the entire contents of which are incorporated herein by reference.

FIELD OF THE INVENTION

The present invention relates to a high-tech temperature control device for a semiconductor manufacturing facility and, more specifically, to a high-tech temperature control device for an electrostatic chuck, which supports a wafer in a semiconductor wafer processing process.

BACKGROUND OF THE INVENTION

As semiconductor elements become more and more high-tech, requirement conditions in a process of manufacturing the semiconductor elements are getting more particular. Particularly, temperature control in deposition and etching processes are the most basic things, and one of the most important process variables. Recently, a semiconductor manufacturing process has become complicated in accordance with formation of a multilayer structure and miniaturization of line width, and control technology capable of satisfying a rapidly changing temperature profile of an electrostatic chuck is preferentially necessary before anything else in order to cope with the complicated process.

Patent Literatures 1 to 3 relate to temperature control devices for a semiconductor electrostatic chuck used to manufacture a semiconductor with a relatively simple structure in the related art. These heat or cool a heat medium supplied to a semiconductor chuck by using a thermoelectric element. The heat medium supplied to the semiconductor chuck is collected, then is cooled by using a thermoelectric element again, and then is circulated to a storage room.

In Patent Literature 1, each of a heating heat medium and a cooling heat medium is supplied to a mixing 3-way valve only as much as a necessary amount by using a separate 3-way valve, and the remaining heat medium is allowed to bypass. The heat medium as much as a necessary amount is mixed in the mixing 3-way valve, and then is supplied to the semiconductor chuck. The heat medium which is supplied to and then collected from the semiconductor chuck is distributed at a ratio of the initial supply, and is transferred to each heating and cooling heat medium storage room. However, it turned out that the device disclosed in Patent Literature 1 cannot cope with a recent semiconductor manufacturing process requiring temperature change of 2° C./second. It has been known that it is difficult to cope with rapid temperature change since the reaction time is slow, and also it is difficult to cope with a temperature range of a process wider than the prior art. In addition, since a collection amount ratio of heat medium is not proper, there is a problem that the heat medium in the storage room is decreased or increased. A small problem in temperature control has a great influence on a yield in a semiconductor manufacturing process, and thus precise control of this is more important than anything else.

CITATION LIST

Patent Literature 1: Korean Registered Patent No. 10-1367086
Patent Literature 2: Korean Registered Patent No. 10-0817419
Patent Literature 3: Korean Laid-Open Patent No. 10-2009-0045857

SUMMARY OF THE INVENTION

In order to solve the problems described above, the present invention is to provide a high-tech temperature control device which can be applied to a temperature range of a process wider than the prior art as well as a rapidly changing temperature profile, minimizes energy consumption by reusing the used heat medium, and can be stably operated because a heat medium level in a heat medium storage room can be kept constant.

According to a first aspect of the present invention, there is provided a temperature control device for a semiconductor manufacturing facility, which adjusts a supply amount of each of cooling and heating heat mediums to control the temperature of a semiconductor manufacturing facility, including: a mixing unit which adjusts a mixing ratio of the heating heat medium and the cooling heat medium, respectively, and supplies the heating heat medium and the cooling heat medium to the semiconductor manufacturing facility; a second cooling unit which finely adjusts the temperature of the cooling heat medium supplied to the mixing unit; a flow rate adjustment unit which is positioned at the front end portion of the mixing unit, and adjusts flow rates of the heating heat medium and the cooling heat medium such that the flow rate of the mixed heat medium transferred from the mixing unit maintains a constant value, a heating heat medium storage unit and a cooling heat medium storage unit which store the heating heat medium and the cooling heat medium supplied from the flow rate adjustment unit, respectively; a first heating unit and a first cooling unit which adjust the heat medium temperatures of the heating heat medium storage unit and the cooling heat medium storage unit, respectively; a collection distribution unit which distributes and supplies the heat medium collected from the semiconductor manufacturing facility such that the levels of the heating heat medium storage unit and the cooling heat medium storage unit maintain a constant value; and a second heating unit which preheats the heat medium supplied to the heating heat medium storage unit of the heat medium supplied from the collection distribution unit before supplying the heat medium to the heating heat medium supply unit.

According to a second aspect of the present invention, the mixing unit is formed of a 3-way valve, and a mixing ratio of the heating and cooling heat mediums is adjusted by adjusting an open ratio of the 3-way valve by using a proportional function. The flow rate adjustment unit allows a part of each heat medium to bypass to be collected to each of the heating heat medium storage unit and the cooling heat medium storage unit, thereby adjusting a flow rate.

According to a third aspect of the present invention, the mixing unit is formed of a simple mixer, and a mixing ratio of the heating and cooling heat mediums is adjusted by adjusting an open ratio of the 2-way valve of the flow rate adjustment unit by using a proportional function.

According to a fourth aspect of the present invention, the second cooling unit finely adjusts the temperature of the cooling heat medium by using a thermoelectric element.

According to a fifth aspect of the present invention, the first cooling unit is installed at a distance sufficiently separated from the semiconductor manufacturing facility such that mechanical vibration generated from the first cooling unit has no influence on the semiconductor manufacturing facility.

According to a sixth aspect of the present invention, the first cooling unit cools the heat medium by using a vapor compression type or absorption type freezing device.

According to a seventh aspect of the present invention, the collection distribution unit adjusts the amount of the heat medium collected by comparing the levels of the heating heat medium storage unit and the cooling heat medium storage unit and performing PID control of the open ratio of the 3-way valve.

According to an eighth aspect of the present invention, external process cooling water is separately supplied to the first cooling unit and the second cooling unit.

According to a ninth aspect of the present invention, the flow rate of the heat medium transferred from the mixing unit maintains a fluctuation value within 5% up and down from a reference value.

According to a tenth aspect of the present invention, the temperature of each heat medium just before the heat medium is supplied to the mixing unit maintains a fluctuation value within 0.2° C. up and down from a reference value.

According to an eleventh aspect of the present invention, there is provided a method for controlling a temperature of a semiconductor manufacturing facility by using the temperature control device for a semiconductor manufacturing facility.

According to a twelfth aspect of the present invention, the second cooling unit preferentially adjusts the temperature of the cooling heat medium, the flow rate adjustment unit adjusts the mixing ratio of the temperature-adjusted cooling heat medium and the heating heat medium, and the mixing unit mixes the heating heat medium and the cooling heat medium and supplies the mixed heat medium to the semiconductor manufacturing facility, thereby controlling the temperature of the semiconductor manufacturing facility. In case of exceeding an offset temperature range adjustable by the temperature adjustment of the second cooling unit or the mixing ratio of the flow rate adjustment unit, the temperature of the heating heat medium or the cooling heat medium stored in the heating heat medium storage unit or the cooling heat medium storage unit is adjusted to another set value through the first heating unit or the first cooling unit.

According to a thirteenth aspect of the present invention, the change of 5° C. of the semiconductor manufacturing facility is performed within 3 seconds and the change of 50° C. is performed within 15 seconds by the temperature control.

DETAILED DESCRIPTION OF THE INVENTION

Hereinafter, embodiments of the present invention will be described in more detail. However, the embodiments are to exemplarily describe the present invention, and the scope of the present invention is not limited to the embodiments.

A temperature control device according to the present invention has the following configuration.

The temperature control device for a semiconductor manufacturing facility, which adjusts a supply amount of each of cooling and heating heat mediums to control the temperature of a semiconductor manufacturing facility, including: a mixing unit 12 which adjusts a mixing ratio of the heating heat medium and the cooling heat medium, and supplies the heating heat medium and the cooling heat medium to the semiconductor manufacturing facility; a second cooling unit 2 which finely adjusts the temperature of the cooling heat medium supplied to the mixing unit 12; a flow rate adjustment unit which is positioned at the front end portion of the mixing unit, and adjusts flow rates of the heating heat medium and the cooling heat medium such that the flow rate of the mixed heat medium transferred from the mixing unit maintains a constant value; a heating heat medium storage unit 4 and a cooling heat medium storage unit 5 which store the heating heat medium and the cooling heat medium supplied from the flow rate adjustment unit, respectively; a first heating unit 6 and a first cooling unit 7 which adjust the heat medium temperatures of the heating heat medium storage unit 4 and the cooling heat medium storage unit 5, respectively; a collection distribution unit 8 which distributes and supplies the heat medium collected from the semiconductor manufacturing facility such that the levels of the heating heat medium storage unit 4 and the cooling heat medium storage unit 5 maintain a constant value; and a second heating unit 9 which preheats the heat medium supplied to the heating heat medium storage unit 4 of the heat medium supplied from the collection distribution unit 8 before supplying the heat medium to the heating heat medium supply unit.

The mixing unit is formed of a 3-way valve 11, and a mixing ratio of the heating and cooling heat mediums is adjusted by adjusting an open ratio of the 3-way valve 11 by using a proportional function. In this case, the flow rate adjustment unit includes a heating heat medium circulation adjustment unit (32) and a cooling heat medium circulation adjustment unit (31) which allow a part of each heat medium to bypass to be collected to each of the heating heat medium storage unit 4 and the cooling heat medium storage unit 5 (see FIG. 1). The open ratio of the 3-way valve 11 is controlled by a feedforward method in accordance with a preset temperature profile.

Figure 2:
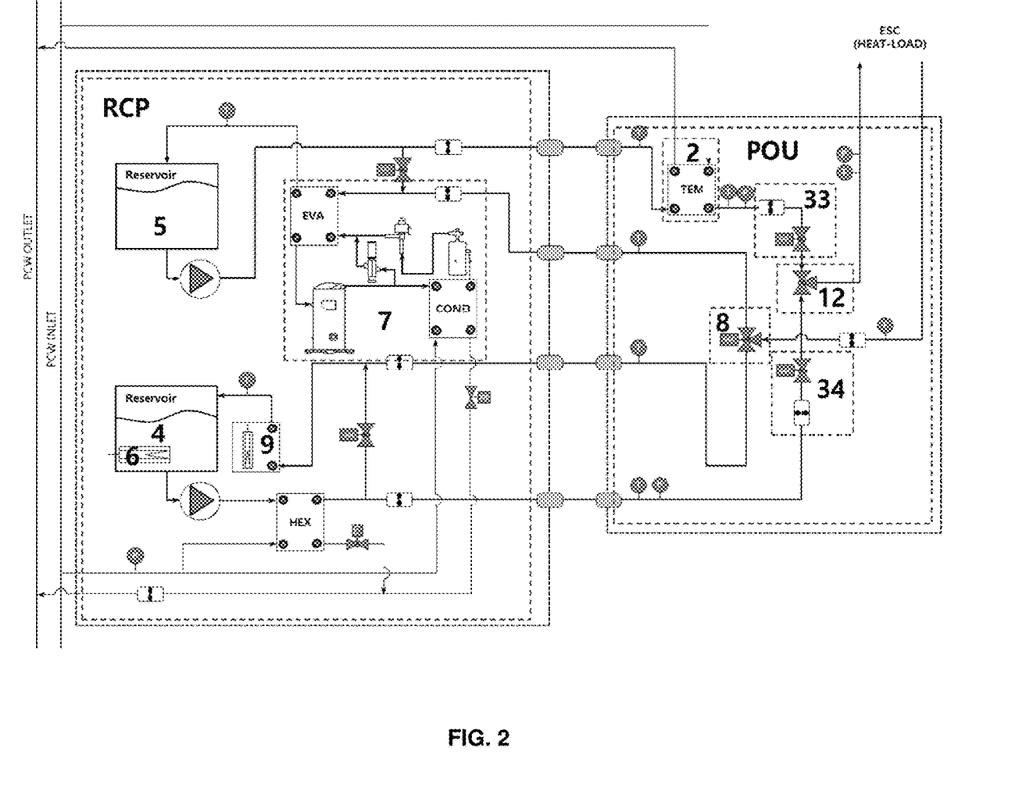
FIG. 2 is a schematic diagram illustrating another embodiment of a temperature control device for a semiconductor manufacturing facility according to the present invention.

In another embodiment of a temperature control device for a semiconductor manufacturing facility according to the present invention, the mixing unit and the flow rate adjustment unit are configured differently (see FIG. 2). The mixing unit is formed of a simple mixer 12, and a mixing ratio of the heating and cooling heat mediums is adjusted by adjusting an open ratio of the 2-way valve constituting a cooling heat medium adjustment unit 33 and a heating heat medium adjustment unit 34 by using a proportional function.

The second cooling unit 2 finely adjusts the temperature of the cooling heat medium by using a thermoelectric element. The second cooling unit 2 is formed of a thermoelectric element to cool and heat, and can primarily adjust the temperature while keeping the flow rates of the heating heat medium and the cooling heat medium constant by measuring the temperature of a semiconductor chuck. Since the thermoelectric element is known, the detail description about this is omitted.

The first cooling unit 7 is installed at a distance sufficiently separated from the semiconductor manufacturing facility such that mechanical vibration generated from the first cooling unit 7 has no influence on the semiconductor manufacturing facility. The heat medium cooled through the first cooling unit 7 is stored in the cooling heat medium storage unit 5, and then is supplied to the second cooling unit 2 through a pipe.

Figure 1:
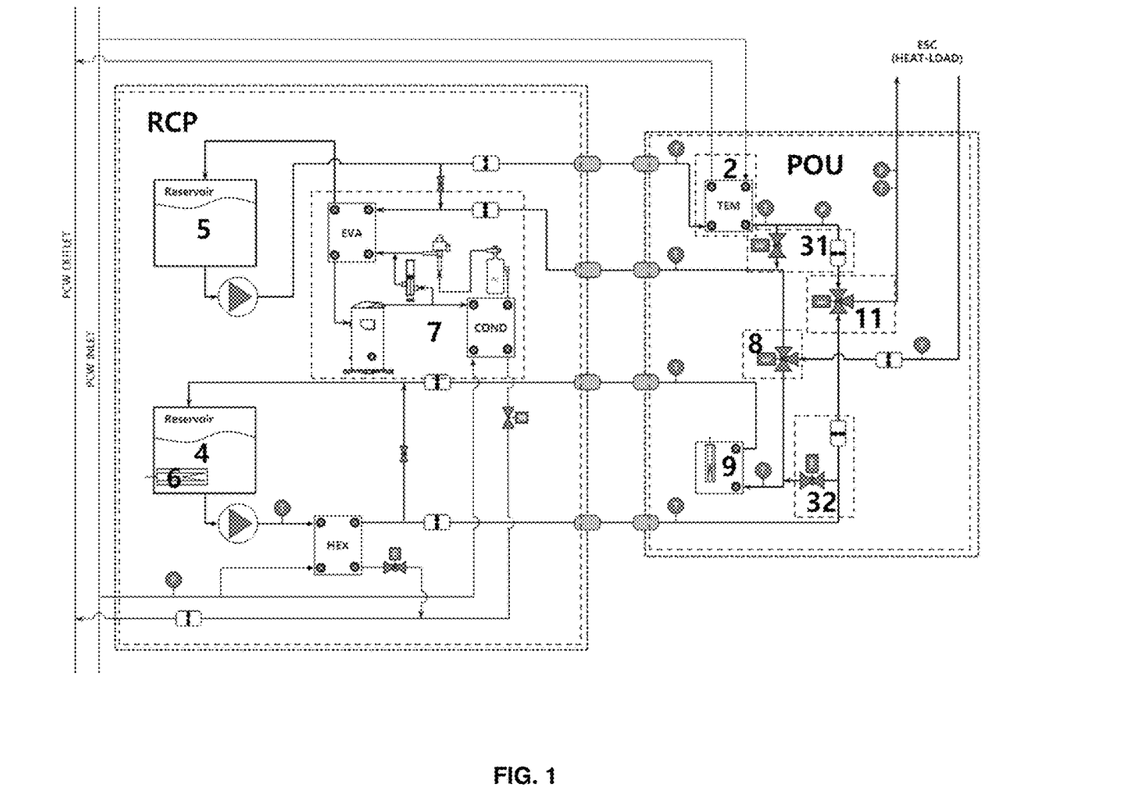
FIG. 1 is a schematic diagram illustrating an embodiment of a temperature control device for a semiconductor manufacturing facility according to the present invention.

In order to supply sufficient cooling capacity, the first cooling unit 7 uses a vapor compression type or absorption type freezing device. In FIG. 1 and FIG. 2, a vapor compression type freezing device is configured as an example of an embodiment. The vapor compression type freezing device is a general vapor compression type freezing device, compresses and expands a separate internally circulated refrigerant to lower the temperature of the refrigerant, and cools the heat medium according to the present invention through a heat exchanger. Meanwhile, the first heating unit 6 and the second heating unit 9 may be all means capable of heating a heat medium, and general means such as steam and electricity may be used.

The first heating unit 6 is positioned in the heating medium storage unit 4, and an additional heat exchanger positioned outside the heating heat medium storage unit 4 is disposed in addition to the first heating unit 6. The additional heat exchanger is prepared for a case where the temperature of the heat medium of the heating heat medium storage unit 4 is raised to a set temperature or higher.

The collection distribution unit 8 adjusts the amount of collected heat medium by adjusting the open ratio of the 3-way valve by using a proportional function. Particularly, the collection distribution unit 8 does not collect the heat medium to the heating heat medium storage unit 4 and the cooling heat medium storage unit 5 in proportional to the flow rates of the heating and cooling heat mediums supplied to the semiconductor manufacturing facility, but adjusts a distribution ratio such that the levels of the heat mediums stored in the heating heat medium storage unit 4 and the cooling heat medium storage unit 5 maintain a constant value. Accordingly, it is possible to stably operate the device.

In order to improve energy efficiency, external process cooling water is separately supplied to the first cooling unit 7 and the second cooling unit 2 as necessary. The process cooling water is general water at room temperature.

Figure 3:
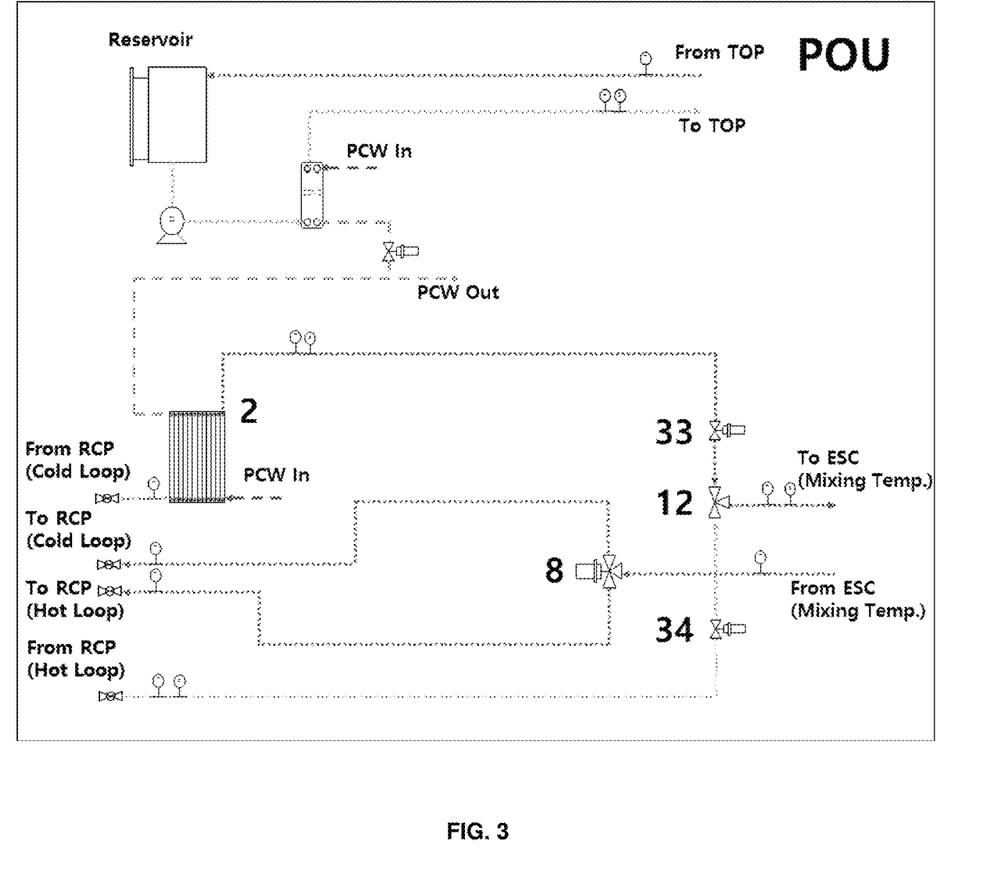
FIG. 3 is a schematic diagram illustrating a proximate temperature control device (POU) of temperature control devices for a semiconductor manufacturing facility according to the present invention.
Figure 4:
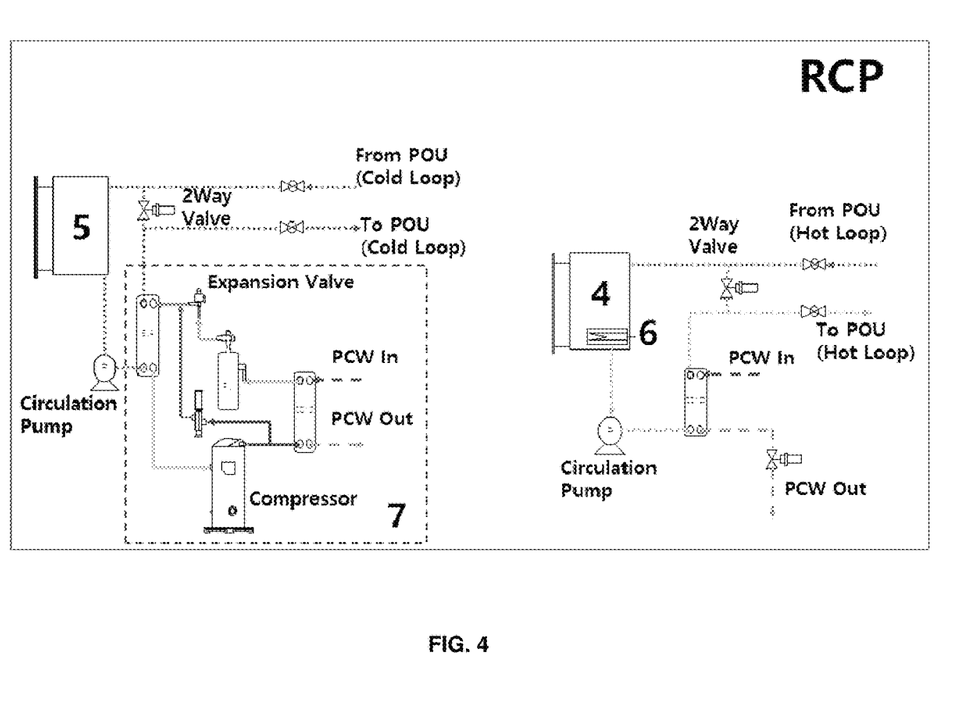
FIG. 4 is a schematic diagram illustrating a remote temperature control device (RCP) of temperature control devices for a semiconductor manufacturing facility according to the present invention.

FIG. 3 and FIG. 4 illustrate a proximate temperature control device (POU) and a remote temperature control device (RCP) of temperature control devices for a semiconductor manufacturing facility illustrated in FIG. 2, respectively. The temperature control device for a semiconductor manufacturing facility illustrated in FIG. 1 also includes a proximate temperature control device and a remote temperature control device similarly with them.

The temperature control device for a semiconductor manufacturing facility according to the present invention includes a proximate temperature control device (POU) which is positioned close to a semiconductor manufacturing facility including a semiconductor chuck, and a remote temperature control device (RCP) which includes a first cooling unit 7. As illustrated in FIG. 1 and FIG. 2, a mixing unit, a second cooling unit 2, a flow rate adjustment unit, and a collection distribution unit 8 are included in the proximate temperature control device (POU), and a heating heat medium storage unit 4, a cooling heat medium storage unit 5, a first heating unit 6, and a first cooling unit 7 are included in the remote temperature control device (RCP). The second heating unit 9 may be disposed in the proximate temperature control device (POU) or the remote temperature control device (RCP) as necessary.

The temperature control device for a semiconductor manufacturing facility according to the invention is operated as follows. First, the flow rate adjustment unit adjusts a mixing ratio of the temperature-adjusted cooling heat medium and the heating heat medium in the remote temperature control device (RCP), the second cooling unit 2 finely adjusts the temperature of the cooling heat medium, and the mixing unit mixes the heating heat medium and the cooling heat medium and supplies the heat medium to the semiconductor manufacturing facility, thereby controlling the temperature of the semiconductor manufacturing facility. The flow rate adjustment unit and the mixing unit may be configured by two kinds illustrated in FIG. 1 and FIG. 2.

As one method of temperature adjustment, the flow rate adjustment unit does not adjust a flow rate, and the temperature may be adjusted only by temperature adjustment of the second cooling unit 2. As another method of temperature adjustment, the temperature of the second cooling unit 2 is not adjusted, and the flow rate adjustment unit adjusts a mixing ratio of the cooling heat medium and the heating heat medium to adjust the temperature. As the other method of temperature adjustment, the temperature of the second cooling unit 2 is adjusted, and also the flow rate adjustment unit adjusts a mixing ratio of the cooling heat medium and the heating heat medium.

As an embodiment according to the invention, when the flow rate adjustment unit uses 2-way valves (33, 34), an open ratio of the 2-way valves (33, 34) according thereto is adjusted by using a proportional function. The proportional function is automatically set by comparing set temperature, actually measured temperature, heat medium flow rate, and the like at the time of starting the temperature control device for a semiconductor manufacturing facility according to the present invention. Setting a control variable in control of a feedback or feedforward method is general control technology, and thus detailed description about this is omitted.

Figure 5:
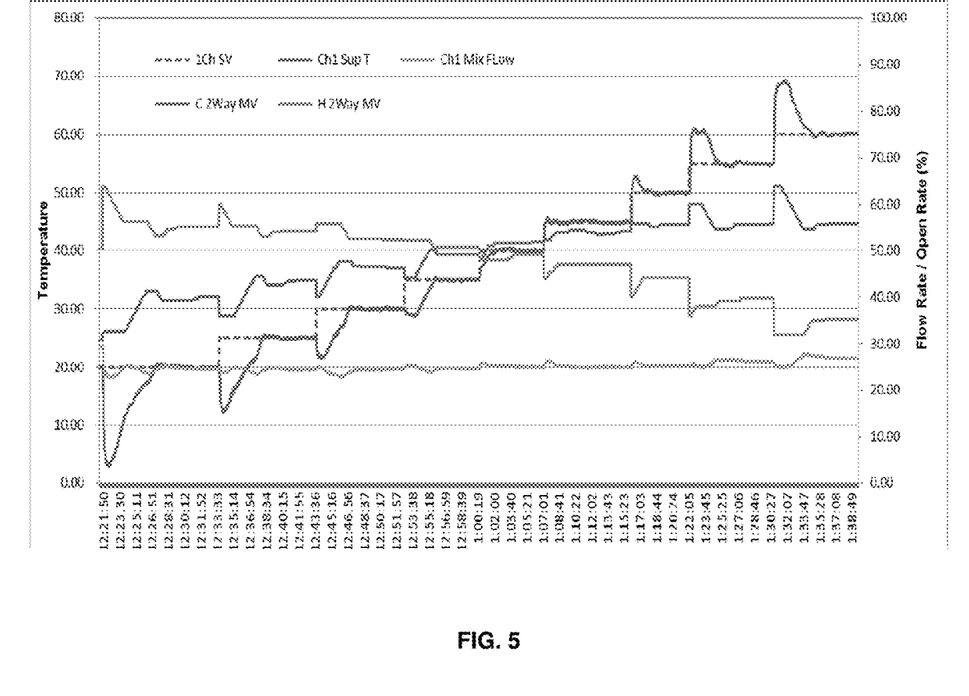
FIG. 5 is a graph illustrating a process of setting temperatures of a heating heat medium and a cooling heat medium and then automatically setting a proportional function for a valve opening rate of a flow rate adjustment unit at the time of starting a device when the temperature control device for a semiconductor manufacturing facility according to the present invention is applied.

FIG. 5 illustrates a process of automatically setting a proportional function for an open ratio of the 2-way valves (33, 34) according to the present invention. Also in this case, it can be known that a flow rate (green) of a mixed heat medium discharged from the mixing unit is constant. The flow rate of the heat medium discharged from the mixing unit maintains a fluctuation value within 5% up and down from a reference value.

In case of exceeding an offset temperature range adjustable by the temperature adjustment of the second cooling unit 2 or the mixing ratio of the flow rate adjustment unit, the temperature of the heating heat medium or the cooling heat medium stored in the heating heat medium storage unit 4 or the cooling heat medium storage unit 5 is adjusted to another set value through the first heating unit 6 or the first cooling unit 7, thereby coping with big change in temperature set value.

A 2-way valve is provided such that the heat medium heated or cooled in the first heating unit 6 or the first cooling unit 7 continues to internally circulate to control the temperature of the heat medium stored in the heating heat medium storage unit 4 or the cooling heat medium storage unit 5.

The temperature control device according to the present invention cools the heat medium by using a separate large-capacity vapor compression type or absorption type freezing device to cope with a case where the range of temperature change is large as compared with the conventional device.

Figure 6:
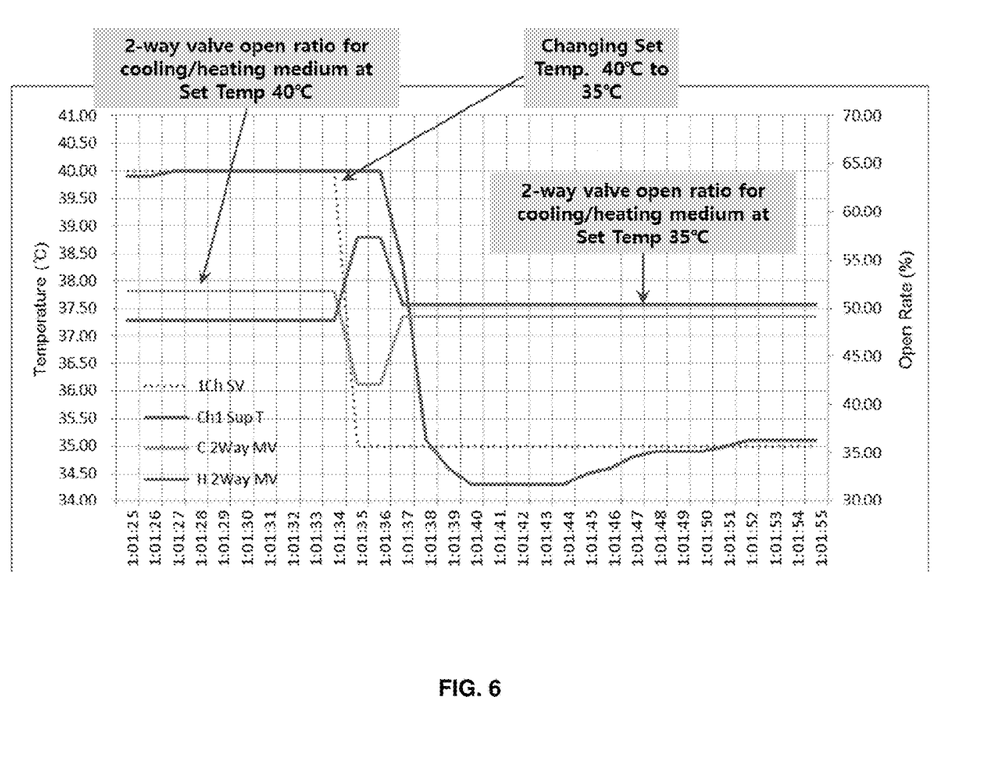
FIG. 6 is a graph illustrating a 2-way valve open ratio for a cooling heat medium of a flow rate adjustment unit, a 2-way valve open ratio for a heating heat medium for a flow rate adjustment unit, and a temperature of a heat medium supplied to a semiconductor manufacturing facility over time when a set temperature is changed stepwise from 40° C. to 35° C. when the temperature control device for a semiconductor manufacturing facility according to the present invention is applied.
Figure 7:
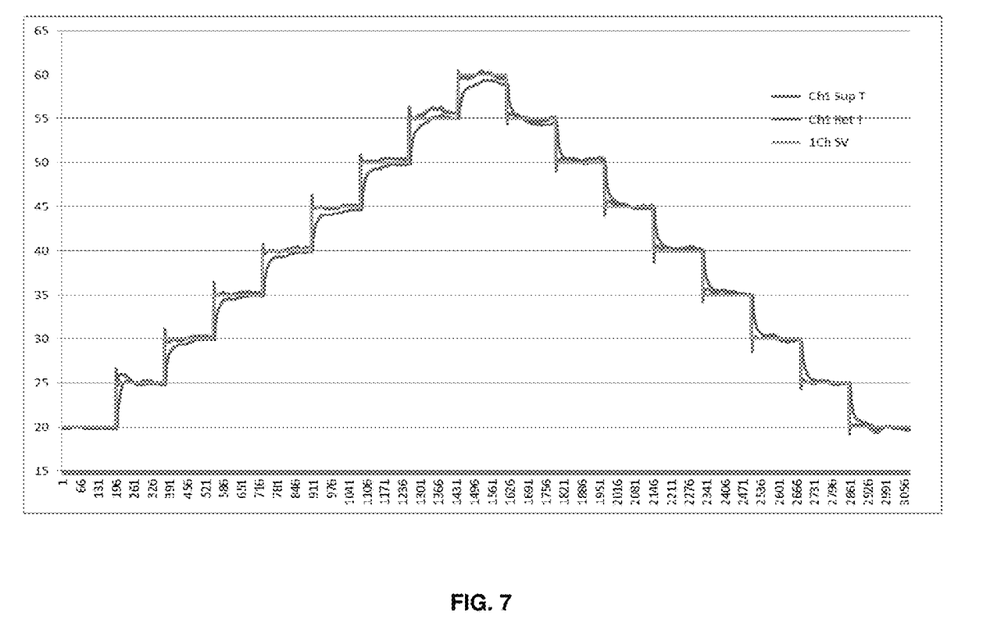
FIG. 7 is a graph illustrating an experiment result for change in actual value according to a temperature set value when the temperature control device for a semiconductor manufacturing facility according to the present invention is applied.

FIG. 6 illustrates a set temperature, a temperature of the heat medium discharged from the mixing unit, and an open ratio of the 2-way valves (33, 34) over time when the fluctuated set value falls within an offset. The change of 5° C. of the semiconductor manufacturing facility according to the present invention is performed within 3 seconds and the change of 50° C. is performed within 15 seconds by the temperature control. In the control method according to the conventional method, 80 seconds are taken for 50° C. The conventional temperature control described above cannot cope with the current high-tech semiconductor manufacturing. In the present invention, such a problem is solved, and performance of temperature control is drastically improved enough to be applied to an actual process. FIG. 7 illustrates that the temperature control device according to the present invention very effectively cope with the continuously fluctuated set temperature change.

The temperature control device according to the present invention adjusts a temperature by adjusting a mixing ratio of the cooling heat medium and the heating heat medium while maintaining a flow rate of the entire heat medium discharged from the mixing unit constant. The conventional temperature control device controls a temperature by total of three 3-way valves disposed in a mixing unit and a flow rate adjustment unit, thus the device gets rather complicated, and a device cost is raised. Nevertheless, temperature control cannot be precise due to correlation between a flow rate and a temperature.

The control device according to the present invention is operated to minimize correlation between variables, and can achieve precise temperature control of a semiconductor chuck which cannot be achieved in the prior art. Even though a configuration is rather simplified, for example, the number of valves used in the present invention is reduced, it is possible to obtain effects which cannot be obtained in the prior art.

For persons skilled in the art, it is obvious that technology of improving precision of temperature control in which inevitable delay is generated between a control signal and a response signal is not easy. In the present invention, correlation between variables is minimized, a flow rate is controlled by a feedback method and a temperature is controlled by a feedforward method on the basis thereof, thereby obtaining an excellent effect which cannot be obtained in the prior art. In addition, the remote temperature control device is introduced to minimize an influence on manufacturing semiconductors as well as to provide sufficient heating and cooling capacity, and thus interference with a semiconductor manufacturing process is minimized as well as temperature control.

The precise temperature control according to the present invention is a variable critical for a production yield of high-integrated semiconductors with fierce competition, and an important factor to judge whether to be applied to an actual process.

Meanwhile, the temperature control device for a semiconductor manufacturing facility according to the invention has excellent energy efficiency. Each bypassing heat medium is mixed with each heat medium collected from the collection distribution unit 8 (see FIG. 1). Accordingly, it is possible to minimize energy loss which may be generated by the collected heat medium.

According to the present invention, it is possible to provide a high-tech temperature control device which can be applied to a temperature range of a process wider than the prior art as well as a rapidly changing temperature profile, minimizes energy consumption by reusing the used heat medium, and can be stably operated because a heat medium level in a heat medium storage room can be maintained constant. Specifically, when the high-tech temperature control device according to the present invention is applied, it is possible to cope with the minimum 0° C. to the maximum 100° C., it is possible to control the change of 5° C. within 3 seconds and to control the change of 50° C. within 15 seconds, and it is possible to maintain a fluctuation value within 0.2° C. up and down in a fixed temperature.

While the present invention has been described with respect to the specific embodiments, it will be apparent to those skilled in the art that various changes and modifications may be made without departing from the spirit and scope of the invention as defined in the following claims.

What is claimed is:

1. A temperature control device for a semiconductor manufacturing facility to adjust a supply amount of each of cooling and heating heat mediums to control a temperature of a semiconductor manufacturing facility, the temperature control device comprising:
   a mixing unit configured to adjust a mixing ratio of corresponding amounts of a heating heat medium and a cooling heat medium of the cooling and heating heat mediums, respectively to supply a mixed heat medium comprising the adjusted mixing ratio of the corresponding amounts of the heating heat medium and the cooling heat medium to the semiconductor manufacturing facility;
   a second cooling unit configured to finely adjust a corresponding temperature of the corresponding amount of the cooling heat medium supplied to the mixing unit;
   a flow rate adjustment unit positioned at the front end portion of the mixing unit and configured to adjust flow rates of the heating heat medium and the cooling heat medium in order to maintain, at a constant value, a flow rate of the mixed heat medium transferred from the mixing unit to the semiconductor manufacturing facility;

a heating heat medium storage unit and a cooling heat medium storage unit configured to store the heating heat medium and the cooling heat medium supplied from the flow rate adjustment unit, respectively;

a first heating unit and a first cooling unit configured to adjust heat medium temperatures of the heating heat medium storage unit and the cooling heat medium storage unit, respectively;

a collection distribution unit configured to distribute and supply a further heat medium collected from the semiconductor manufacturing facility in order to maintain constant levels of the heating heat medium storage unit and the cooling heat medium storage unit; and a second heating unit configured to preheat at least a portion of the further heat medium from the collection distribution unit before supplying the preheated portion of the further heat medium to the heating heat medium supply unit.

2. The temperature control device for a semiconductor manufacturing facility according to claim 1, wherein the mixing unit is formed of a 3-way valve, and the mixing ratio of the heating and cooling heat mediums is adjusted by adjusting an open ratio of the 3-way valve by using a proportional function.

3. The temperature control device for a semiconductor manufacturing facility according to claim 2, wherein the flow rate adjustment unit allows a part of each of the cooling and heating heat mediums to bypass the mixing unit and to be collected to each of the heating heat medium storage unit and the cooling heat medium storage unit, respectively, for adjusting said flow rate.

4. The temperature control device for a semiconductor manufacturing facility according to claim 1, wherein the mixing unit is formed of a simple mixer, and the mixing ratio of the heating and cooling heat mediums is adjusted by adjusting an open ratio of a 2-way valve by using a proportional function.

5. The temperature control device for a semiconductor manufacturing facility according to claim 1, wherein the second cooling unit is configured to finely adjust the temperature of the cooling heat medium by using a thermoelectric element.

6. The temperature control device for a semiconductor manufacturing facility according to claim 1, wherein the first cooling unit is installed at a distance sufficiently separated from the semiconductor manufacturing facility such that a mechanical vibration generated from the first cooling unit has no influence on the semiconductor manufacturing facility.

7. The temperature control device for a semiconductor manufacturing facility according to claim 1, wherein the first cooling unit is configured to cool the heat medium by using a vapor compression type device or an absorption type freezing device.

8. The temperature control device for a semiconductor manufacturing facility according to claim 1, wherein the collection distribution unit is configured to adjust the amount of the heat medium collected by comparing the levels of the heating heat medium storage unit and the cooling heat medium storage unit and performing a PID control of the open ratio of the 3-way valve.

9. The temperature control device for a semiconductor manufacturing facility according to Claim 5, wherein an external process cooling water is separately supplied to the first cooling unit and the second cooling unit.

10. The temperature control device for a semiconductor manufacturing facility according to claim 1, wherein the flow rate of the mixed heat medium transferred from the mixing unit have a fluctuation value within 5% up and down from a reference value.

11. The temperature control device for a semiconductor manufacturing facility according to claim 1, wherein a respective temperature of each of the corresponding amounts of the heating heat medium and the cooling heat medium just before being supplied to the mixing unit has a fluctuation value within 0.2° C. up and down from a reference value.

12. A method for controlling a temperature of a semiconductor manufacturing facility by using the temperature control device for a semiconductor manufacturing facility according to claim 1.

13. The method for controlling a temperature of a semiconductor manufacturing facility according to claim 12, wherein the second cooling unit is configured to adjust preferentially the temperature of the cooling heat medium, the flow rate adjustment unit is configured to adjust the mixing ratio of the temperature-adjusted cooling heat medium and the heating heat medium, and the mixing unit is configured to mix the heating heat medium and the cooling heat medium and to supply the mixed heat medium to the semiconductor manufacturing facility, for controlling the temperature of the semiconductor manufacturing facility, and wherein in case of exceeding an offset temperature range adjustable by the temperature adjustment of the second cooling unit or the mixing ratio of the flow rate adjustment unit, the temperature of the heating heat medium or the cooling heat medium stored in the heating heat medium storage unit or the cooling heat medium storage unit is adjusted to another set value through the first heating unit or the first cooling unit.

14. The method for controlling a temperature of a semiconductor manufacturing facility according to claim 12, wherein a temperature change of 5° C. of the semiconductor manufacturing facility is performed within 3 seconds and the temperature change of 50° C. is performed within 15 seconds using the temperature control device.

* * * * *